United States Patent
Chen et al.

(10) Patent No.: US 7,211,516 B2
(45) Date of Patent: May 1, 2007

(54) NICKEL SILICIDE INCLUDING INDIUM AND A METHOD OF MANUFACTURE THEREFOR

(75) Inventors: Peijun J. Chen, Dallas, TX (US); Duofeng Yue, Plano, TX (US); Amitabh Jain, Allen, TX (US); Sue Crank, Coppell, TX (US); Thomas D. Bonifield, Dallas, TX (US); Homi Mogul, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/096,660

(22) Filed: Apr. 1, 2005

(65) Prior Publication Data

US 2006/0223295 A1 Oct. 5, 2006

(51) Int. Cl.
*H01L 21/44* (2006.01)
(52) U.S. Cl. ................ 438/682; 438/721; 438/583; 438/649; 438/651; 257/E21; 257/6; 257/296; 257/593

(58) Field of Classification Search ................ 438/682, 438/683, 684, 685, 686, 647, 648, 721, 510, 438/583, 651, 649
See application file for complete search history.

(56) References Cited

U.S. PATENT DOCUMENTS

| 5,960,270 | A | * | 9/1999 | Misra et al. ................. 438/197 |
| 6,033,537 | A | * | 3/2000 | Suguro ..................... 204/192.2 |
| 6,713,391 | B2 | * | 3/2004 | Yi et al. ..................... 438/682 |
| 7,045,444 | B2 | * | 5/2006 | Yamazaki et al. ........... 438/471 |

* cited by examiner

*Primary Examiner*—David Nhu
(74) *Attorney, Agent, or Firm*—Peter K. McLarty; W. James Brady, III; Frederick J. Telecky, Jr.

(57) ABSTRACT

The present invention provides a semiconductor device, a method of manufacture therefore and a method for manufacturing an integrated circuit including the same. The semiconductor device, among other elements, may include a substrate (110), as well as a nickel silicide region (170) located over the substrate (110), the nickel silicide region (170) having an amount of indium located therein.

16 Claims, 6 Drawing Sheets

NICKEL SILICIDE INCLUDING INDIUM AND A METHOD OF MANUFACTURE THEREFOR

TECHNICAL FIELD OF THE INVENTION

The present invention is directed, in general, to a method for manufacturing a semiconductor device and, more specifically, to an improved nickel silicided including indium, a method of manufacture therefore, and a method for manufacturing an integrated circuit including the same.

BACKGROUND OF THE INVENTION

Traditional metal-oxide-semiconductor (MOS) transistors often use metal silicide layers to reduce resistance. A self-aligned silicidation process (salicide) is often used to form the region of titanium, cobalt or tungsten silicide on the gate electrode and source/drain regions of the MOS transistor. In this process, a blanket metal film is deposited on the silicon substrate containing the MOS transistor structure. The metal is then reacted with the underlying silicon regions to form a low resistance metal silicide. Any unreacted metal remaining on the substrate is then removed using a metal etch process that is selective to the remaining metal silicide.

In order to reduce the resistances associated with the metal silicide regions, nickel is finding increasing use in forming the metal silicide regions in MOS transistors, particularly for transistors with physical gate lengths of less than 65 nm and/or MOS transistors with ultra-shallow junctions. Nickel, unfortunately, has a very high diffusivity in silicon leading to the formation of nickel silicide regions that extend beneath the transistor sidewall structures. Regrettably, the nickel silicide regions that extend beneath the transistor sidewall structures tend to lead to nickel silicide excessive encroachment defects extending into the channel region of the MOS transistor. In a similar manner, the high diffusivity of nickel causes excessive spike defects into the source/drain regions. As would be expected, the encroachment and spike defects tend to cause serious acceptance, manufacturability, and ultimately device yield problems.

There is therefore a need for a method to form nickel silicide regions in MOS transistors that does not experience the severe defect issues caused by the traditional methods.

SUMMARY OF THE INVENTION

To address the above-discussed deficiencies of the prior art, the present invention provides a semiconductor device, a method of manufacture therefore and a method for manufacturing an integrated circuit including the same. The semiconductor device, among other elements, may include a substrate, as well as a nickel silicide region located over the substrate, the nickel silicide region having an amount of indium located therein.

As previously noted, another inventive aspect of the present invention is a method for manufacturing a semiconductor device somewhat similar to that just detailed. The method for manufacturing the semiconductor device, without limitation, may include placing an indium region in a silicidable substrate, and forming a nickel silicide region in at least a portion of the indium region the nickel silicided region having a reduced number of defects therein as a result of the inclusion of indium within the silicidable substrate prior to the forming the nickel silicided region. A method for manufacturing an integrated circuit is further provided, wherein the method for manufacturing the integrated circuit includes many of the same elements as the method for manufacturing the semiconductor device, with the addition of forming interconnects within dielectric layers located over the substrate for electrically contacting the semiconductor devices.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention is based, at least in part, on the inclusion of indium into a nickel silicided formation process. The inclusion of indium into a region about to be silicided with nickel, substantially retards encroachment defects, or sometimes called piping defects, as well as spike defects that have only recently been attributed to the high diffusivity of nickel. Accordingly, indium, as compared to certain other dopants including antimony and germanium, provides unexpected results in that it not only causes the silicided region to form uniformly as both antimony and germanium do, but it additionally retards the undesirable encroachment and spike defects. Moreover, indium unexpectedly provides a lower resistance contact between the silicided region and the source/drain region or the gate electrode layer, than that previously obtained by any other method. Thus, the use of indium does not introduce the contact resistance degradation that may occur with antimony, germanium or another dopant that is not indium.

Accordingly, indium allows efficient defect reduction in nickel silicides with lower cumulative ion implantation damage, due to its higher atomic mass. Accordingly, the defects and cumulative ion implantation damage have a limited impact on the semiconductor device performance. Similarly, indium can minimize PMOS transistor drive current degradation, as compared to other species such as germanium, because it is a p-type dopant that can be activated at relatively low temperatures. Therefore, the silicided/diffusion specific contact resistance is improved. Furthermore, the indium does not experience the large yield degradation that antimony experiences, as it has a higher atomic mass. For example, more cumulative implant damage exists beyond the amorphized silicon for lower atom mass atoms, such as antimony.

Figure 1A:
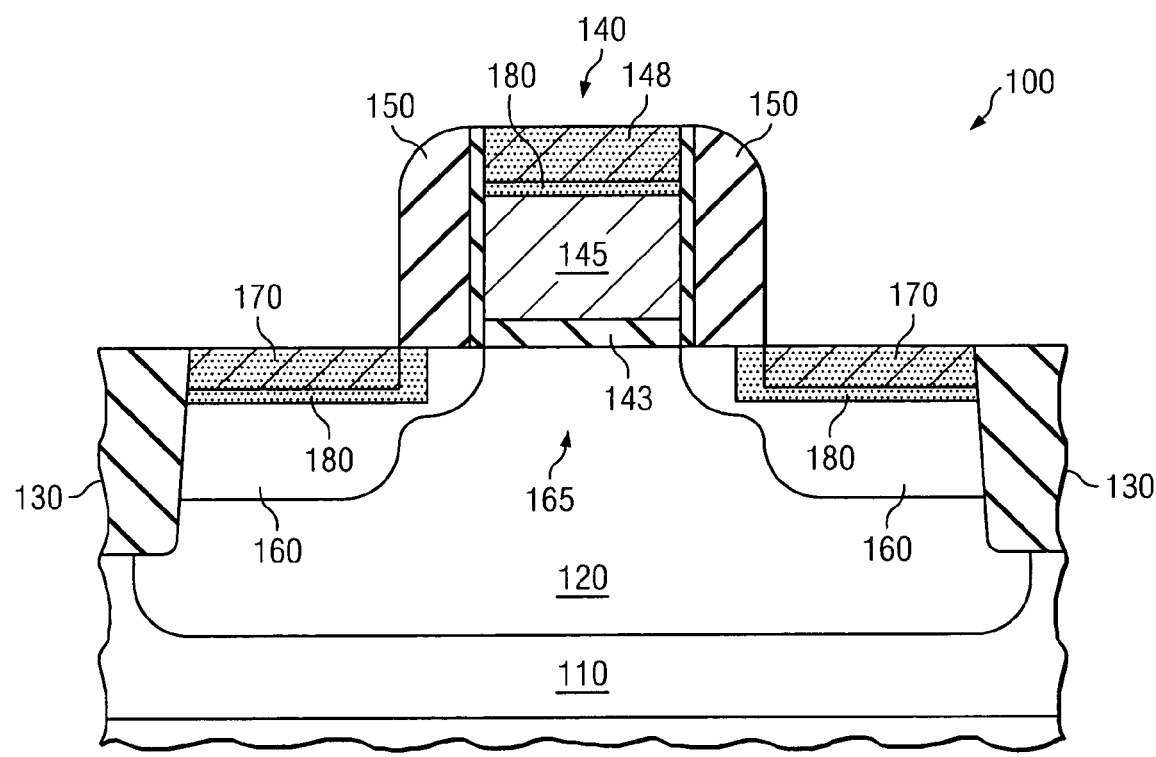
FIGS. 1A–1C illustrate a cross-sectional view of different embodiments of a semiconductor device that was constructed according to the principles of the present invention.

Turning now to FIG. 1A, illustrated is a cross-sectional view of a semiconductor device 100 that was constructed according to the principles of the present invention. The semiconductor device 100 of FIG. 1A initially includes a substrate 110 having a well region 120 located therein. Located over the well region 120, and separated by isolation structures 130, is a gate structure 140. The gate structure 140 includes a gate dielectric layer 143, a gate electrode layer 145, and a nickel silicided gate electrode layer 148. Flanking both sides of the gate structure 140 are sidewall spacers 150. While it is illustrated in FIG. 1A that the sidewall spacers 150 comprise multiple layers, such is not always the case.

Located within the substrate 110 and proximate the gate structure 140 are source/drain regions 160. The source/drain regions 160, as is appreciated by one skilled in the art, are separated from one another by a distance, thereby forming a channel region 165. Positioned within the source/drain regions 160 are nickel silicide regions 170.

Uniquely contained within either one or both of the nickel silicided regions 170 or nickel silicided gate electrode layer 148, for example in the lattice structure of one or both of those regions, is indium. The indium, in the embodiment illustrated in FIG. 1A, is contained within indium regions 180 that encompass at least a portion of the nickel silicided regions 170 or nickel silicided gate electrode layer 148. In one exemplary embodiment, the indium regions 180 encompass the entire nickel silicided regions 170 or nickel silicided gate electrode layer 148. Accordingly, in this embodiment, the nickel silicided regions 170 or nickel silicided gate electrode layer 148 are formed entirely within a boundary created by the indium regions 180. To accommodate this desire, a minimum concentration of indium of at least about 1E19 atoms/cm$^3$ should, in an exemplary embodiment, extend from about 8 nm to about 40 nm into the surface they are being included within. When certain ones of the aforementioned desires are achieved, an appropriate concentration of indium may be located at an interface between one or both of the nickel silicided regions 170 or nickel silicided gate electrode layer 148, and the source/drain regions 160 or gate electrode layer 145, respectively. In certain instances, the indium may advantageously pile-tip at this interface and provide a lower resistance contact. Certain other atoms, such as germanium and antimony, have not been observed to advantageously pile-up, such as indium has.

The indium regions 180 constructed in accordance with the principles of the present invention typically have a peak concentration of indium greater than about 1E19 atoms/cm$^3$. In many instances, however, the peak concentration of indium ranges from about 5E19 atoms/cm$^3$ to about 5E20 atoms/cm$^3$. The peak concentration is often tied to the indium dose required to form an amorphous silicon region. However, other concentrations outside of those just disclosed are within the scope of the present invention.

Figure 1B:
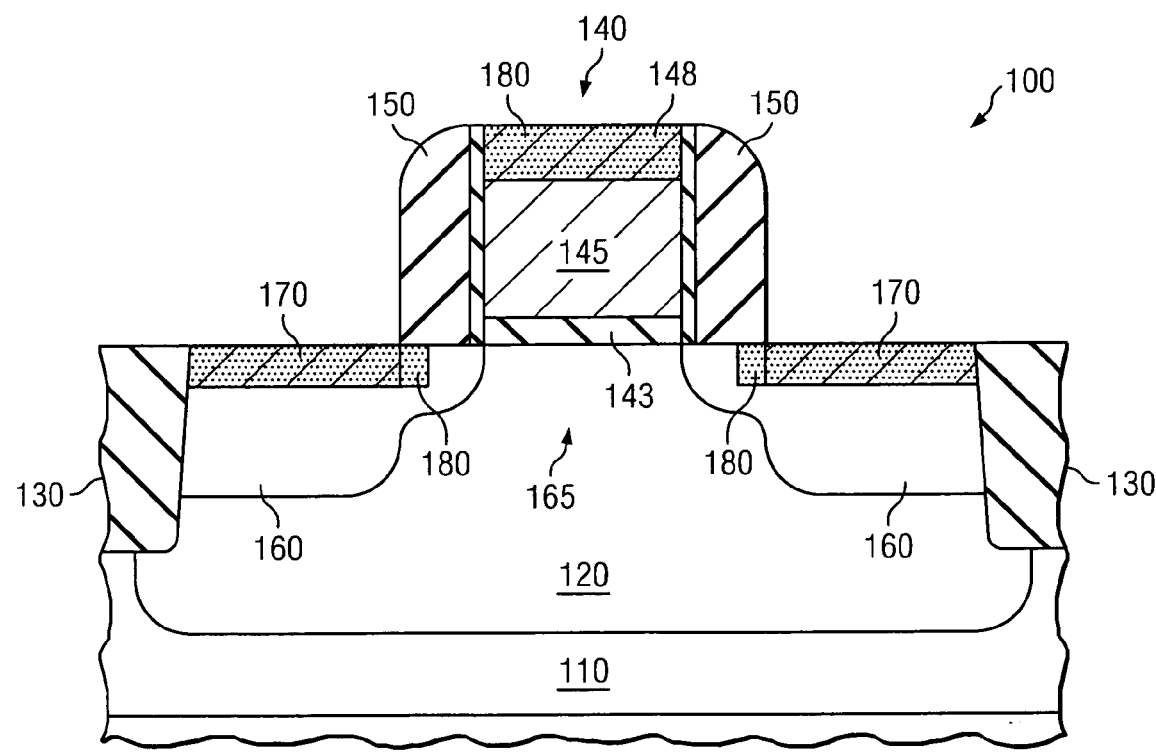

Turning now to FIG. 1B, illustrated is a cross-sectional view of another embodiment of a semiconductor device manufactured in accordance with the principles of the present invention. The semiconductor device 100 illustrated in FIG. 1B is substantially similar to the semiconductor device 100 illustrated in FIG. 1A; thus, similar reference numbers denote similar features. However, one of the most notable differences between the semiconductor devices 100 of FIGS. 1A and 1B, is the position of nickel silicided regions 170 or nickel silicided gate electrode layer 148 with respect to the indium regions 180. For example, while the indium regions 180 extend past the nickel silicided regions 170 or nickel silicided gate electrode layer 148 in the embodiment of FIG. 1A, the indium regions 180 and nickel silicided regions 170 or nickel silicided gate electrode layer 148 are substantially coincident in the embodiment of FIG. 1B. Further, while not shown in FIG. 1B, the lateral dimensions of the indium regions 180 and nickel silicided regions 170 or nickel silicided gate electrode layer 148 may also be substantially coincident.

Figure 1C:
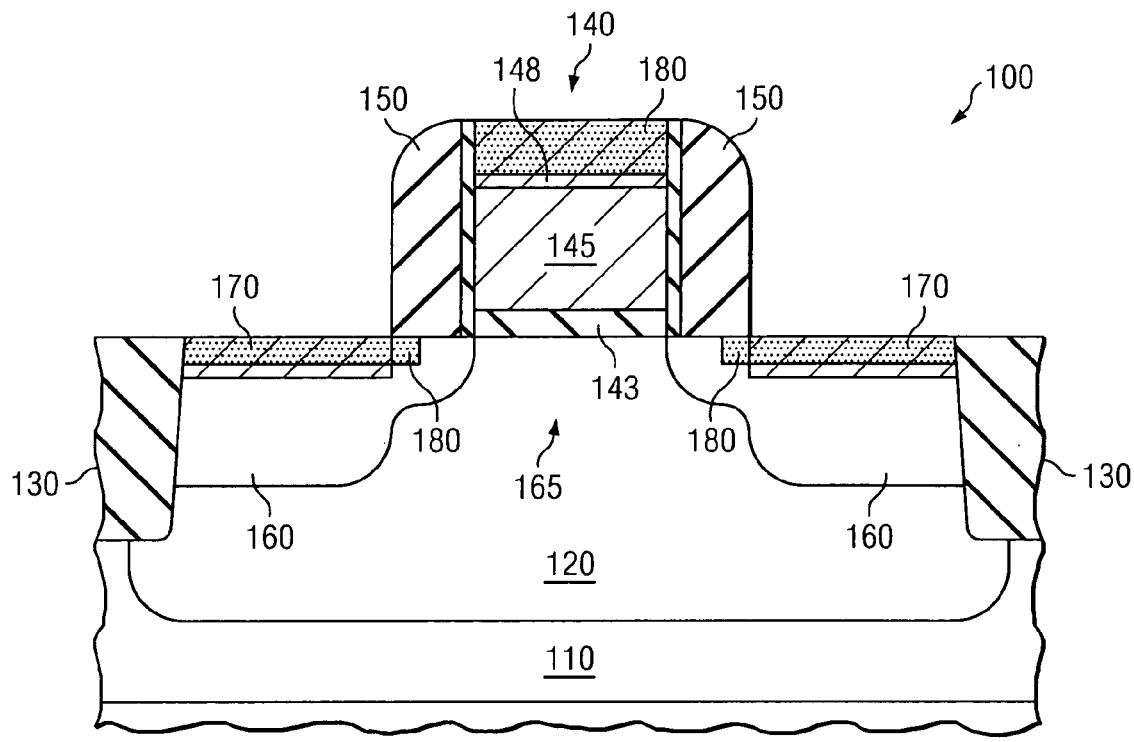

Turning now to FIG. 1C, illustrated is a cross-sectional view of another embodiment of a semiconductor device manufactured in accordance with the principles of the present invention. The semiconductor device 100 illustrated in FIG. 1C is substantially similar to the semiconductor device 100 illustrated in FIGS. 1A and 1B, thus, similar reference numbers denote similar features. Again, one of the most notable differences between the semiconductor devices 100 of FIGS. 1A and 1B, and that of FIG. 1C, is the position of nickel silicided regions 170 or nickel silicided gate electrode layer 148 with respect to the indium regions 180. In this embodiment, one or both of the nickel silicided regions 170 or nickel silicided gate electrode layer 148 extend past the indium regions 180. Further, while not shown in FIG. 1C, the lateral dimensions of the indium regions 180 could be such that the indium regions 180 are entirely within a boundary created by one or both of the nickel silicided regions 170 or nickel silicided gate electrode layer 148.

Turning now to FIGS. 2–5, illustrated are cross-sectional views of detailed manufacturing steps instructing how one might, in an advantageous embodiment, manufacture a semiconductor device in accordance with the principles of the present invention. The partially completed semiconductor device 200 of FIG. 2 includes a substrate 210. The substrate 210 may, in an exemplary embodiment, be any layer located in the partially completed semiconductor device 200, including a wafer itself or a layer located above the wafer (e.g., epitaxial layer). In the illustrative embodiment shown, the substrate 210 comprises a silicidable material.

Figure 2:
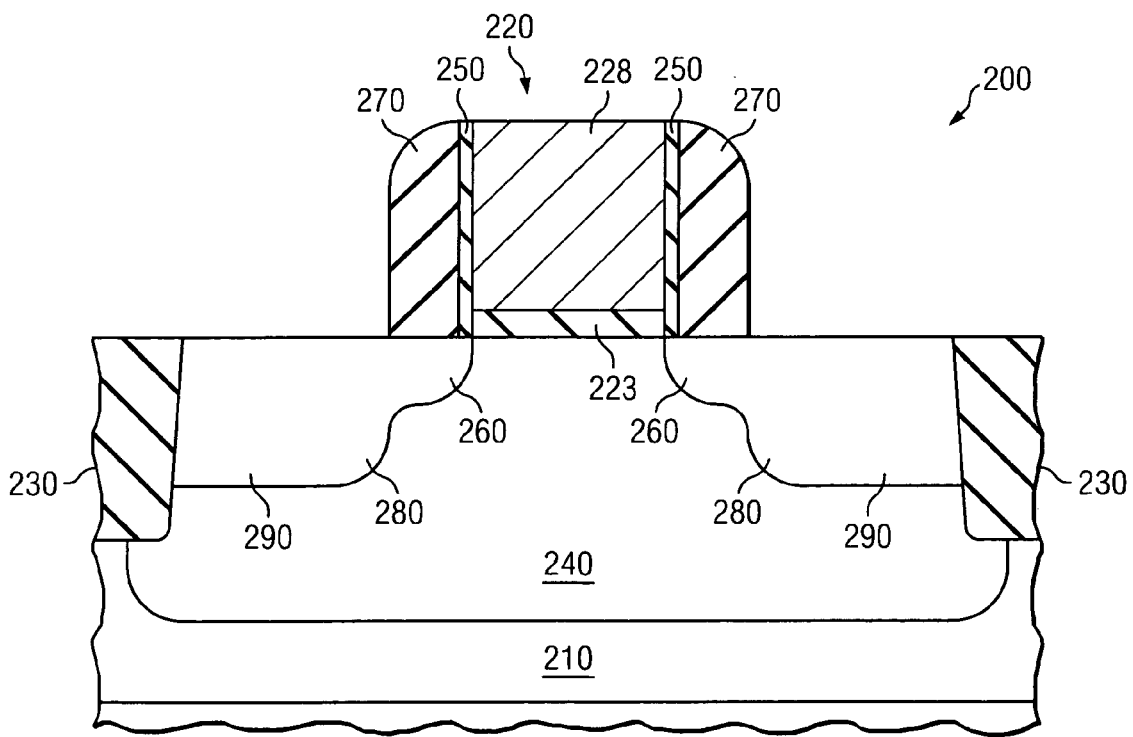
FIG. 2 illustrates a cross-sectional view of a partially completed semiconductor device at an initial stage of manufacture.

As is illustrated in FIG. 2, a gate structure 220 is formed over the substrate 210. The gate structure 220, in the embodiment shown, includes a gate dielectric layer 223 and a gate electrode layer 228. The gate dielectric layer 223 may, for example, comprise an oxide, thermally grown SiO$_2$, a nitride, an oxynitride, or any combination thereof, and preferably has a thickness ranging from about 1 nm to about 20 nm. The gate dielectric layer 223 can also be formed using a high K dielectric material with a dielectric constant greater than about 3.9. Some examples of high K dielectric material include hafnium-containing dielectrics such as hafnium oxide, hafnium oxynitride, etc.

As previously indicated, the gate structure 220 further includes a gate electrode layer 228. The gate electrode layer 228 in one advantageous embodiment comprises a layer of silicon-containing material formed on the gate dielectric layer 223. Preferably, this silicon-containing material is comprised of polycrystalline silicon ("poly" or "polysilicon"), but it may comprise amorphous silicon, epitaxial silicon or any other semiconducting material. Accordingly, the gate electrode layer 228 may comprise a silicidable material.

Located within the substrate 210 and between isolation regions 230 is a well region 240. The well region 240 in the substrate 210 shown in FIGS. 2–5 can be either n-type or p-type. In forming CMOS integrated circuits, n-type and p-type well regions 240 are formed in the substrate 210. In the case of an n-well region, a PMOS transistor will be formed. In a similar manner for a p-well region, an NMOS transistor will be formed.

With the gate structure 220 defined using standard photolithography processes and polysilicon etching, a spacer 250 is formed, for example, by first thermally growing about 1 nm to about 5 nm of oxide followed by depositing about 15 nm of TEOS oxide. In other embodiments the spacer 250 can comprise a combination of silicon nitride and/or silicon oxide (either grown or deposited) layers.

For a PMOS transistor where the well region 240 comprises a portion of an n-type well, a blanket p-type lightly doped implant is performed resulting in the lightly doped extension implants 260. The p-type lightly doped extension implants 260 are often referred to as lightly doped drain (LDD) or moderately doped drain (MDD) extension regions. The p-type lightly doped extension implants 260 are conventionally formed and generally have a peak dopant concentration ranging from about 1E19 atoms/cm$^3$ to about 2E20 atoms/cm$^3$.

In addition to the p-type lightly doped extension implants 260, pocket implants (not shown) are sometimes performed. For the case where the semiconductor device 200 shown in FIG. 2 is a PMOS transistor, the pocket implants would comprise an n-type dopant species. In current integrated circuit technology, pocket implants refer to an implant that is used to reduce the effect of the short transistor gate length on transistor properties such as threshold voltage. The effect of the pocket implant is not however limited to threshold voltage. The pocket implant for a particular transistor type usually results in a doping profile that extends beyond the drain extension of the transistor. The species of the n-type pocket implant can consist of As, P or any other suitable n-type dopant. The species of the p-type lightly doped extension implants 260 can consist of boron or any other suitable p-type dopant. The order of the implants is somewhat arbitrary and the pocket implant can be performed before the p-type lightly doped extension implants 260.

For an NMOS transistor where well region 240 comprises a portion of a p-type well, a blanket n-type lightly doped implant is performed resulting in n-type lightly doped extension implants 260. The n-type lightly doped extension implants 260 are also often referred to as a lightly doped drain (LDD) or a moderately doped drain (MDD) extension region. The n-type lightly doped extension implants 260 are conventionally formed and generally have a peak dopant concentration ranging from about 1E19 atoms/cm$^3$ to about 2E20 atoms/cm$^3$.

In addition to the n-type lightly doped extension implants 260, pocket implants are again sometimes performed. For the case where the transistor shown in FIG. 2 is an NMOS transistor, the pocket implant would comprise a p-type dopant species. The species of the p-type pocket implant can consist of B, BF$_2$, Ga, In, or any other suitable p-type dopant. The species of the n-type lightly doped extension implants 260 can consist of As, P, Sb, or any other suitable n-type dopant. The order of the implants is again somewhat arbitrary and the n-type lightly doped extension implants 260 could be performed before the pocket implant.

After the completion of the lightly doped extension implants 260 (and pocket implant if performed), and any subsequent processing, sidewall spacers 270 are formed as shown in FIG. 2. In an embodiment of the instant invention, the sidewall spacers 270 comprise a plurality of silicon oxide and silicon nitride dielectric layers. The sidewall spacers 270 are formed by first depositing blanket layers of suitable dielectric material. An anisotropic etch is then used to form the sidewall spacers 270. The sidewall spacers 270 can also be formed using a single suitable dielectric material such as silicon nitride or silicon oxide.

Following the formation of the sidewall spacers 270, highly doped source/drain implants 280 are formed. For a PMOS transistor, p-types dopants such as boron are implanted into the substrate 210 adjacent to the sidewall spacers 270 to form the highly doped source/drain implants 280. For an NMOS transistor, n-type dopants such as arsenic and/or phosphorous are implanted into the substrate 210 adjacent to the sidewall spacers 270 to form the highly doped source/drain implants 280. The highly doped source/drain implants 280 are conventionally formed and generally have a peak dopant concentration ranging from about 1E18 atoms/cm$^3$ to about 1E21 atoms/cm$^3$.

Following the formation of the highly doped source/drain implants 280, a high temperature source/drain anneal may be performed to activate the implanted dopants and remove the damage to the substrate 210 created during the ion implantation process. What results are source/drain regions 290. The source/drain anneal can comprise a rapid thermal annealing (RTA) process where the source/drain regions 290 are annealed at temperatures above about 800° C. for times ranging from about a second to minutes.

The source/drain regions 290 illustrated in FIG. 2 happen to be standard implanted source/drain regions. Another embodiment exists wherein the source/drain regions 290 are raised source/drain regions. In this embodiment, trenches may be formed in the substrate 210 proximate both sides of the gate structure 220 and thereafter filled with a material such as silicon germanium. The silicon germanium would then act as the material within which the source/drain regions 290 are formed. Regardless of the type of source/drain regions 290 used by the present invention, the inventive aspects of using indium remain substantially the same.

Figure 3:
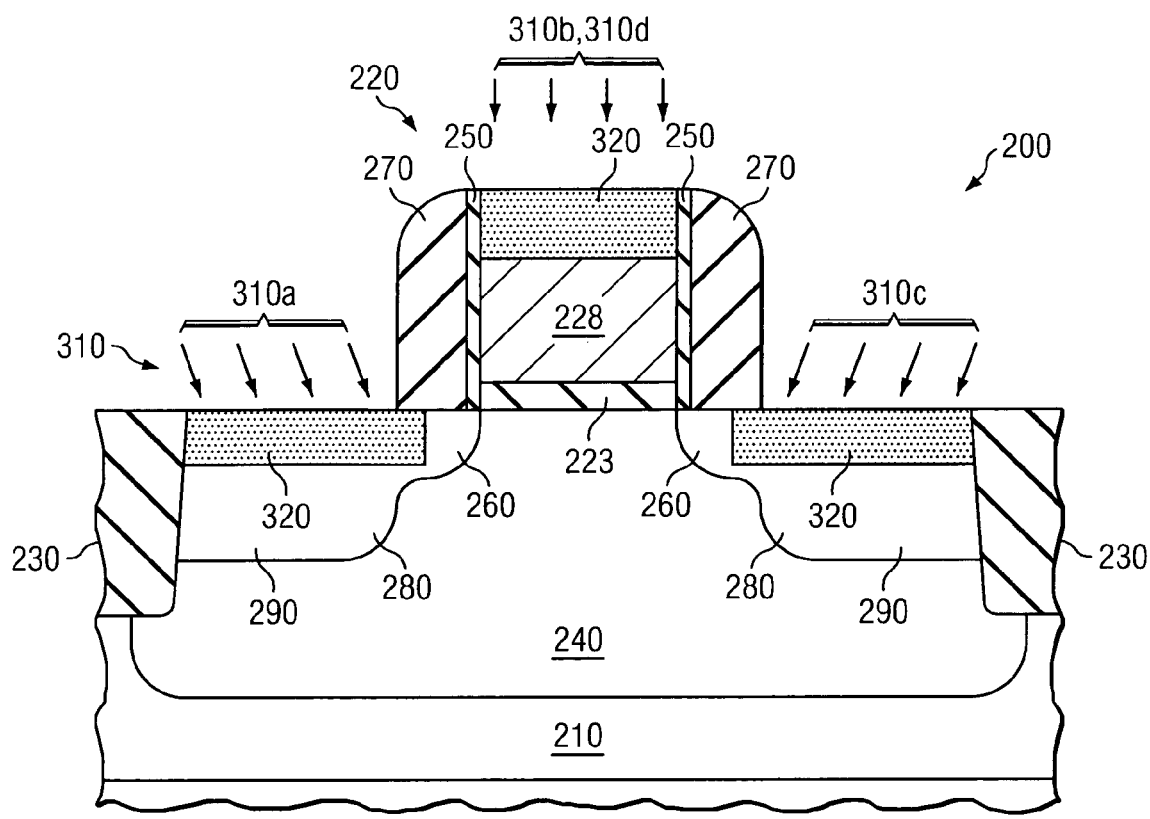
FIG. 3 illustrates a cross-sectional view of the partially completed semiconductor device illustrated in FIG. 2 after placing an indium region in one or both of the substrate and gate electrode layer.

Turning now to FIG. 3, illustrated is a cross-sectional view of the partially completed semiconductor device 200 illustrated in FIG. 2 after placing an indium region 320 in one or both of the substrate 210 and gate electrode layer 228. In the embodiment of FIG. 2, the indium regions 320 are created by ion implanting indium into particular regions of the semiconductor device 200 using an indium dose 310. When the indium dose 310 is high enough, the ion implantation forms amorphous silicon regions in the substrate 210 and gate electrode layer 228. For instance, it is generally desirable that the indium dose 310 be greater than about 1E13 atoms/cm$^2$ to form the aforementioned amorphous silicon regions. In addition, it is generally desirable that the indium dose 310 be less than about 1E15 atoms/cm$^2$ or the indium dose 310 causes undesirable indium clusters in the substrate 210 and gate electrode layer 228. Accordingly, one exemplary embodiment of the present invention uses an indium dose 310 ranging from about 8E13 atoms/cm$^2$ to about 2E14 atoms/cm$^2$. Other undisclosed indium doses 310 are, however, within the scope of the present invention.

As illustrated in FIG. 3, the indium regions 320 desirably extend into the substrate 210 and gate electrode layer 228 a specific distance. Ideally, the indium regions 320, and amorphous silicon regions when the indium dose 310 is sufficient, should extend into the substrate 210 and gate electrode layer 228 a distance sufficient to surround any silicided region that may subsequently be formed therein. In most instances, it has been observed that the indium regions 320 should extend into the substrate 210 and gate electrode layer 228 from about 8 nm to about 40 nm to accomplish the aforementioned surrounding effect. Typically an ion implant energy ranging from about 5 keV to about 50 keV is sufficient to accomplish the aforementioned depths.

The indium regions 320 also desirably extend, to some extent, under the gate structure 220, as illustrated in FIG. 3. This may be accomplished using a number of different methods; however, one particular method includes using an angled implant, such as an implant angle from greater than about 0 degrees to about 30 degrees. Implant angles of nine degrees, fifteen degrees and twenty-five degrees have been attempted, each providing some degree of benefit.

As is often the case, a quad implant (e.g., by rotating the substrate) may be used to achieve the appropriate concentration of indium in the desired portions of the semiconductor device 200 when using the angled implants. Such an embodiment is shown in FIG. 3 using the references 310a–310d, which attempt to illustrate the different incoming implant dose configurations for a quad implant. For example, an initial implant could be conducted using the angled indium dose 310a, which is rotated a number of degrees from normal and approaches the substrate 210 from the left. The implant source or the substrate could then be revolved by about 90 degrees, thus resulting in the angled implant dose 310b approaching the substrate 210 from out of the page. The implant source or the substrate 210 could again be revolved by about 90 degrees, thus resulting in the angled implant dose 310c approaching the substrate 210 from the right. The implant source or the substrate could then be revolved by about 90 degrees, thus resulting in the angled implant dose 310d approaching the substrate 210 from into the page. While a quad implant scenario has been discussed in somewhat detail, other implant scenarios, including dual, tri, etc., could also be used.

Although not illustrated in FIG. 3, after the inclusion of the indium, one or more cleaning processes may be performed on the semiconductor device 200. For example, a post-implant clean, such as SPM (e.g., $H_2SO_4/H_2O_2$) plus SC1 may be performed. Other cleaning processes may include a hydrofluoric acid dip, an $NF_3$ clean, and/or a pre-sputter etch ("PSE").

Figure 4:
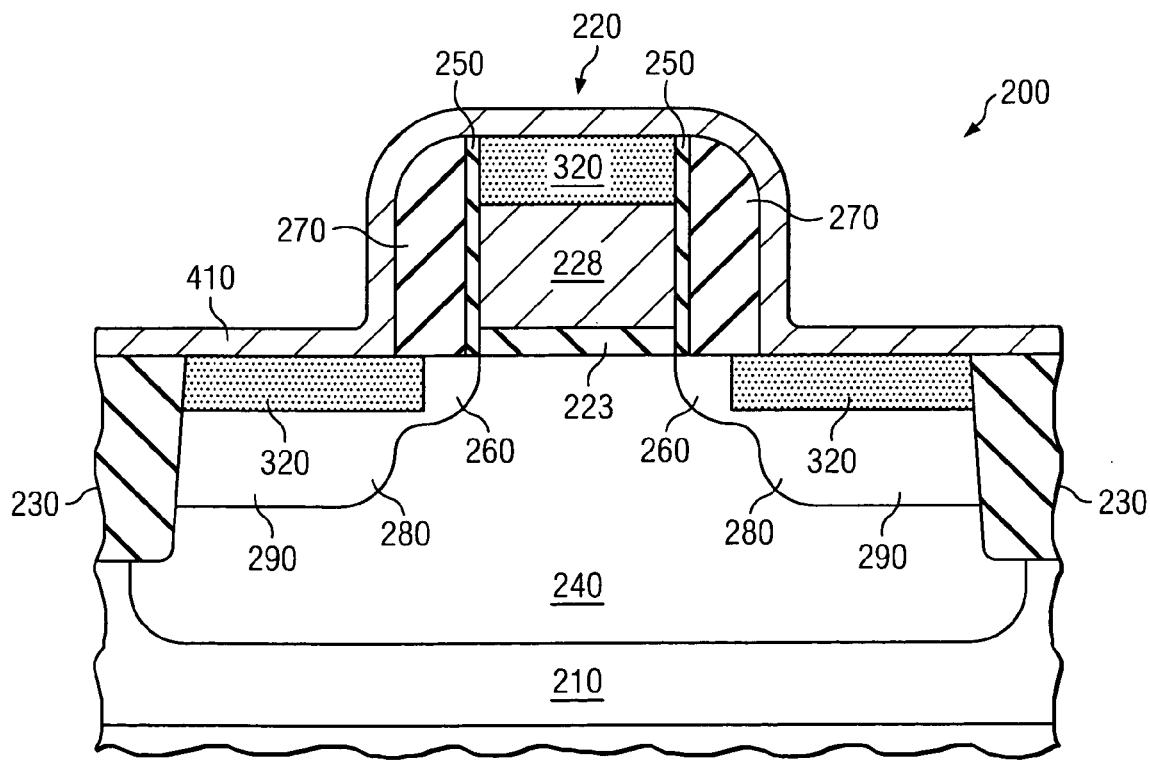
FIG. 4 illustrates a cross-sectional view of the partially completed semiconductor device illustrated in FIG. 3 after forming a nickel-containing layer over the gate electrode layer and source/drain regions.

Turning now to FIG. 4, illustrated is a cross-sectional view of the partially completed semiconductor device 200 illustrated in FIG. 3 after forming a nickel-containing layer 410 over the gate electrode layer 228 and source/drain regions 290. In one exemplary embodiment, the nickel-containing layer 410 is formed immediately following the formation of the indium regions 320. However, other embodiments exist wherein the formation of the nickel-containing layer 410 does not immediately follow the formation of the indium regions 320.

The nickel-containing layer 410 may be formed using any suitable growth and/or deposition techniques used in semiconductor processing. In one embodiment, a thickness of the nickel-containing layer 410 is between about 3 nm and about 40 nm. In a more particular embodiment of the invention, a thickness of the nickel-containing layer 410 is between about 5 nm and about 15 nm.

Figure 5:
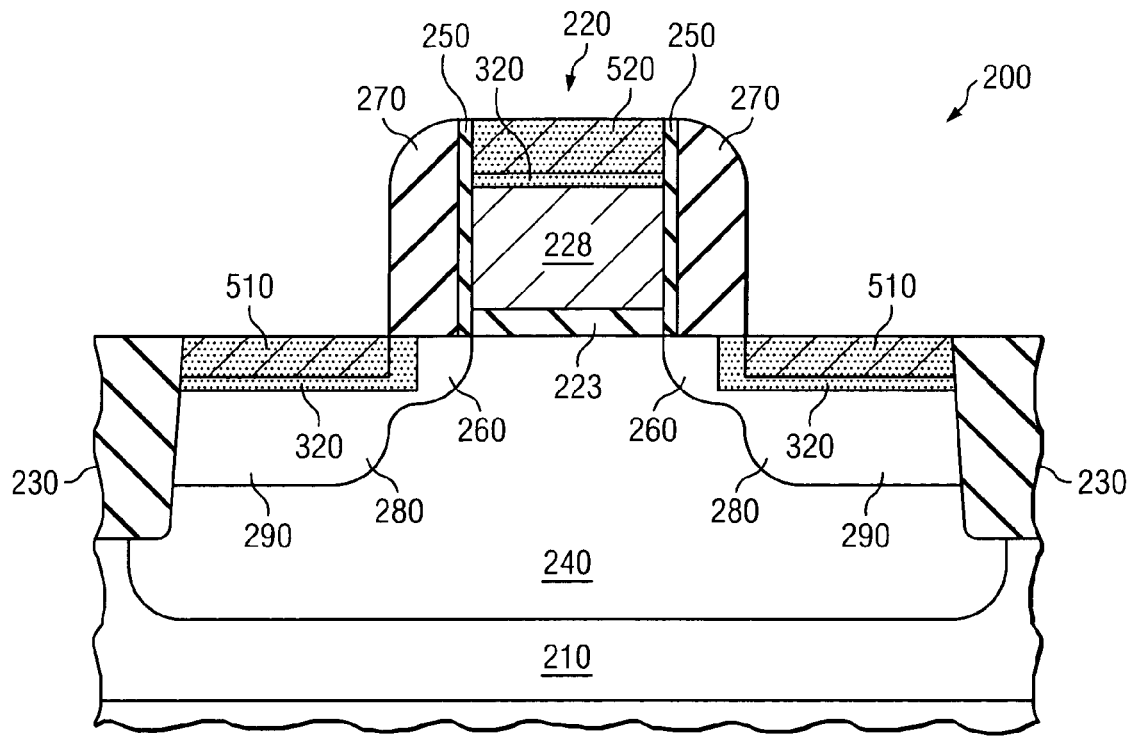
FIG. 5 illustrates a cross-sectional view of the partially completed semiconductor device illustrated in FIGURE 4 after subjecting the nickel-containing layer to an anneal, thereby causing the nickel-containing layer to react with the underlying silicon regions to form nickel suicide regions.

Turning to FIG. 5, illustrated is a cross-sectional view of the partially completed semiconductor device illustrated in FIG. 4 after subjecting the nickel-containing layer 410 to an anneal, thereby causing the nickel-containing layer 410 to react with the underlying silicon regions to form nickel silicide regions 510, 520. It should be noted that no reaction takes place in the embodiment of FIG. 5 between the nickel-containing layer 510 and the sidewall spacers 270. Notice how the nickel silicide regions 510, 520 are located entirely within the indium regions 320 in the embodiment of FIG. 5. This is but one embodiment consistent with the principles of the present invention. For example, other embodiments exist, such as shown in FIGS. 1B and 1C, wherein the nickel silicide regions 510, 520 are not located entirely within the indium regions 320. Accordingly, the present invention should not be limited to the embodiment illustrated and discussed with respect to FIG. 5.

In some embodiments of the invention, after the silicidation process, any unreacted nickel from the nickel-containing layer 410 is stripped using any suitable stripping technique used in semiconductor processing. After the stripping of the unreacted nickel from the nickel-containing layer 410, a second silicide anneal process may be performed. In some embodiments, this additional silicide anneal forms nickel monosilicide from nickel-rich silicide. In one embodiment, this additional silicide anneal process is performed at a temperature ranging from about 300° C. to about 550° C. for a time period of between about 0.1 seconds and about 300 seconds. In a more particular embodiment of the invention, this additional silicide anneal process is performed at a temperature of approximately 400° C. for a time period of approximately thirty seconds.

In some embodiments of the invention, a solid phase epitaxial ("SPE") regrowth process may be performed by heating the substrate 210 in order to recrystallize any amorphous silicon that did not silicidize during the nickel silicidation process. In one embodiment, this SPE anneal process may be performed by heating the substrate 210 at a temperature greater than about 500° C., and more particularly between about 550° C. and about 750° C. for a time period of between about one second and about 30 minutes. In another exemplary embodiment of the invention, the SPE anneal process is performed by heating the substrate 210 to a temperature of between about 550° C. and about 600° C. for a time period of between about 10 seconds and about 15 minutes. Other suitable process parameters are contemplated by the present invention, for example a second single anneal step that accommodates both the formation of the nickel monosilicide and the SPE regrowth. Nevertheless, the resulting structure should have limited, if any, amorphous silicon remaining between the nickel silicided regions 510, 520 and the source/drain regions 290 and gate electrode layer 228, respectively.

The embodiment discussed above with respect to FIGS. 2–5 represents but one embodiment of the present invention. Accordingly, other embodiments exist. For example, there is also the possibility of a combination approach whereby a first implant species is used to form an initial amorphized region in the silicon, followed by an indium dose to form a completed amorphized region in the silicon. In this embodiment either the first implant species or indium could be used to play the primary amorphization function, and the order is reversible.

Figure 6:
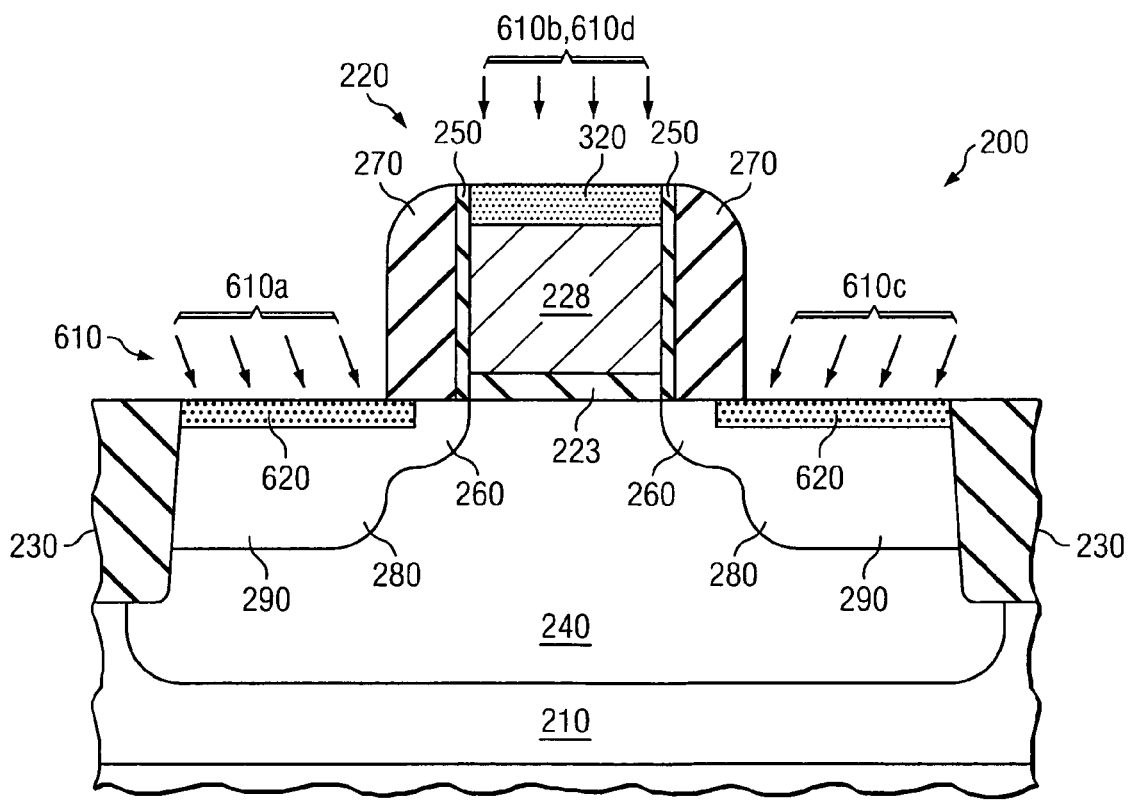
FIGS. 6–7 illustrate a cross-sectional view of an alternative embodiment of a method for manufacturing a semiconductor device in accordance with the principles of the present invention.
Figure 7:
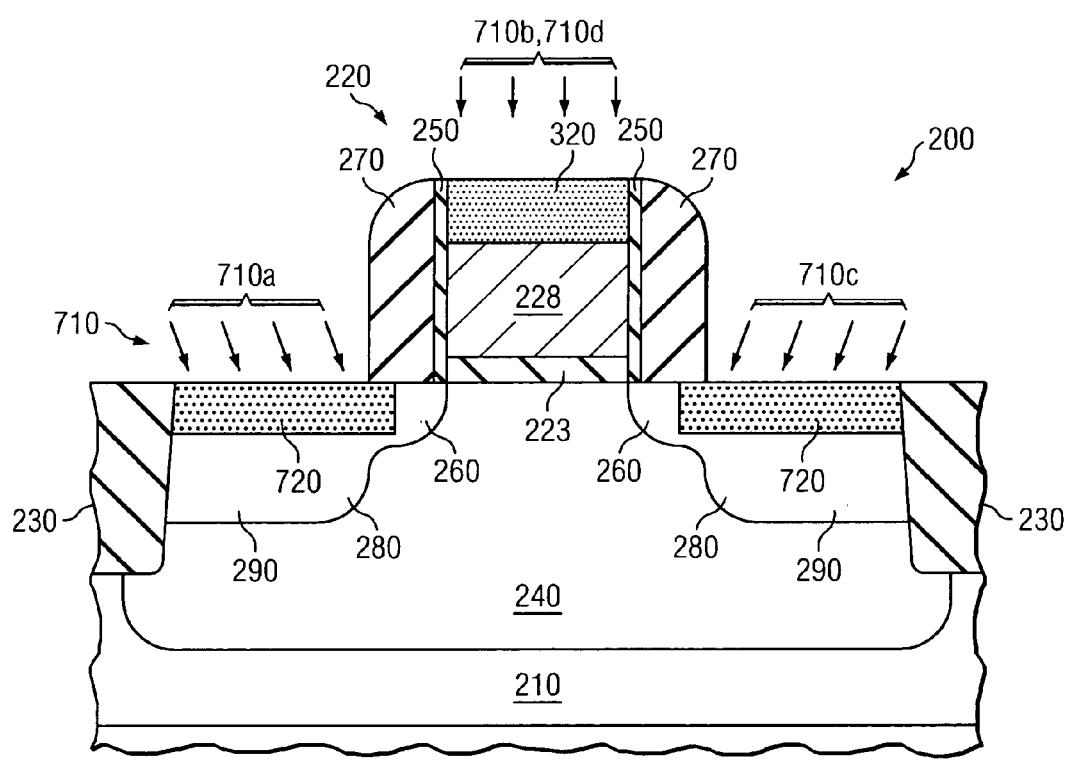
Figure 8:
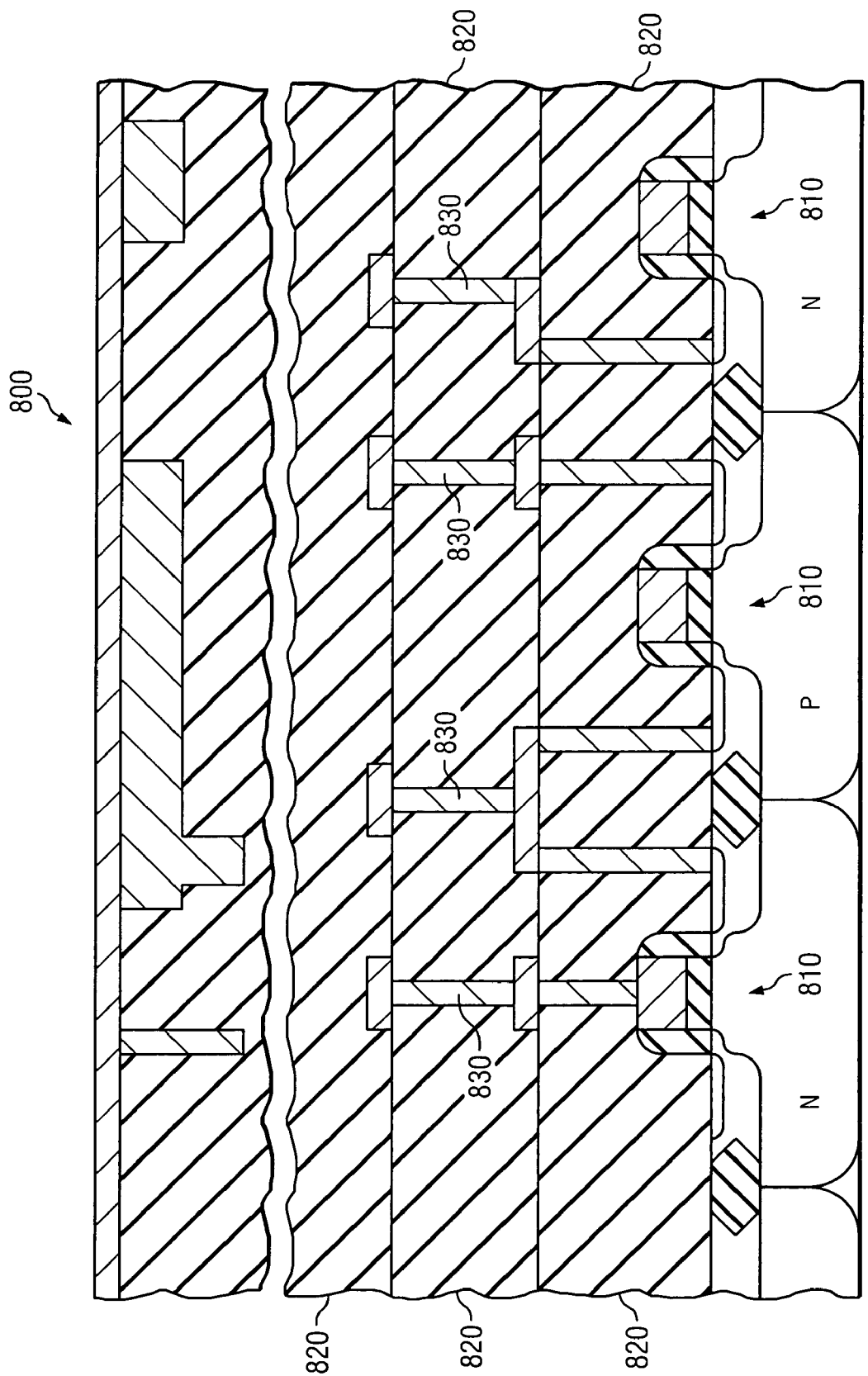
FIG. 8 illustrates a cross-sectional view of a conventional integrated circuit (IC) incorporating a semiconductor device constructed according to the principles of the present invention.

This embodiment is illustrated in FIGS. 6–8, wherein like numbers are used to illustrate substantially similar features to those illustrated in FIGS. 1–4. As illustrated in FIG. 6, the partially completed semiconductor device 200 is being subjected to a first implant species 510 (depicted as 610a, 610b, 610c, and 610d), resulting in the initial amorphized regions 620. Thereafter in FIG. 7 the partially completed semiconductor device 200 is being subjected to an indium dose 710 (depicted as 710a, 710b, 710c, and 710d), resulting in the completed amorphized regions 720. The process could then pick back up from FIG. 4 and complete its manufacture. As previously discussed, the steps of FIGS. 6 and 7 could also be reversed.

Another embodiment, not shown, exists wherein the first implant species fully amorphizes the silicon and the indium is included in the amorphized region at a lesser dose to provide certain advantages, for instance less contact resistance between the nickel silicided region and the source/drain region or gate electrode layer. Conceivably, the lesser dose of indium could be included within the silicon prior to the first implant species fully amorphizing the silicon, resulting in similar structures. Another embodiment, not shown, exists wherein the indium is included within the substrate prior to the annealing of the source/drain regions. In summation, the options and advantages of including indium within the silicon in accordance with the principles of the present invention are limitless.

Referring finally to FIG. 8, illustrated is a cross-sectional view of a conventional integrated circuit (IC) 800 incorporating a semiconductor device 810 constructed according to the principles of the present invention. The IC 800 may include devices, such as transistors used to form CMOS devices, BiCMOS devices, Bipolar devices, or other types of devices. The IC 800 may further include passive devices, such as inductors or resistors, or it may also include optical devices or optoelectronic devices. Those skilled in the art are familiar with these various types of devices and their manufacture. In the particular embodiment illustrated in FIG. 8, the IC 800 includes the semiconductor devices 810 having dielectric layers 820 located thereover. Additionally, interconnect structures 830 are located within the dielectric layers 820 to interconnect various devices, thus, forming the operational integrated circuit 600.

Although the present invention has been described in detail, those skilled in the art should understand that they can make various changes, substitutions and alterations herein without departing from the spirit and scope of the invention in its broadest form.

What is claimed is:

1. A method for manufacturing a semiconductor device, comprising:
    placing an indium region in a silicidable substrate; and
    forming a nickel silicide region in at least a portion of the indium region, the nickel silicide region having a reduced number of defects therein as a result of placing the indium region in the silicidable substrate prior to the forming the nickel silicide region.

2. The method as recited in claim 1 wherein placing an indium region in the silicidable substrate includes ion implanting indium into the silicidable substrate to form an amorphous silicon region containing indium.

3. The method as recited in claim 2 wherein ion implanting includes ion implanting using a dose of indium greater than about 1E13 atoms/cm$^2$.

4. The method as recited in claim 2 wherein ion implanting includes ion implanting using a dose of indium ranging from about 8E13 atoms/cm$^2$ to about 2E14 atoms/cm$^2$.

5. The method as recited in claim 2 wherein ion implanting includes ion implanting using an energy ranging from about 5 keV to about 50 keV.

6. The method as recited in claim 2 wherein ion implanting indium includes ion implanting indium using an angled implant having an implant angle greater than about 0 degrees to about 30 degrees, with or without substrate rotation.

7. The method as recited in claim 2 further including causing solid phase epitaxial regrowth of the amorphous silicon region by annealing the silicidable substrate using a temperature of greater than about 500° C.

8. The method as recited in claim 1 wherein the indium region extends from about 8 nm to about 40 nm into the silicidable substrate.

9. The method as recited in claim 1 wherein placing an indium region in a silicidable substrate includes placing an indium region in a source/drain region located within the silicidable substrate, and wherein the nickel silicide region is formed entirely within a boundary created by the indium region.

10. The method as recited in claim 9 wherein forming a nickel silicide region entirely within the boundary created by the indium region, includes forming a nickel-containing layer over the silicidable substrate and annealing the nickel-containing layer and silicidable substrate using a first temperature to form the nickel silicide region.

11. The method as recited in claim 10 further including removing any unreacted portions of the nickel-containing layer and then annealing the silicidable substrate using a second temperature to further form the nickel silicided region and cause solid phase epitaxial regrowth of any amorphous silicon regions located in the silicidable substrate.

12. The method as recited in claim 10 wherein the source/drain regions are annealed prior to forming the nickel-containing layer and wherein the indium regions are formed in a step immediately preceding forming the nickel-containing layer.

13. The method as recited in claim 9 wherein placing an indium region in a silicidable substrate further includes placing an indium region in a gate electrode layer, and wherein the nickel silicide region is further formed in at least a portion of the indium region placed in the gate electrode layer.

14. A method for manufacturing an integrated circuit, comprising:
    forming semiconductor devices over a substrate, including;
        forming gate structures over the substrate, each of the gate structures including a gate dielectric layer and a gate electrode layer;
        forming source/drain regions in the substrate proximate the gate structures;
        placing indium regions in the source/drain regions; and
        forming nickel silicide regions in at least a portion of each of the indium regions, the nickel silicide regions region having a reduced number of defects therein as a result of placing indium regions in the source/drain regions prior to the forming the nickel silicide regions; and forming interconnects within dielectric layers located over the substrate for electrically contacting the semiconductor devices.

15. The method as recited in claim 14 wherein forming nickel silicide regions in at least a portion of each of the indium regions, includes forming a nickel-containing layer over the indium regions and annealing the nickel-containing layer and indium regions to form the nickel silicide regions.

16. The method as recited in claim 14 wherein the source/drain regions are annealed prior to forming the nickel-containing layer and wherein the indium regions are formed in a step immediately preceding forming the nickel-containing layer.

* * * * *